United States Patent
Leem

[11] Patent Number: 6,143,659
[45] Date of Patent: Nov. 7, 2000

[54] METHOD FOR MANUFACTURING ALUMINUM METAL INTERCONNECTION LAYER BY ATOMIC LAYER DEPOSITION METHOD

[75] Inventor: Hyeun-seog Leem, Kyungki-do, Rep. of Korea

[73] Assignee: Samsung Electronics, Co., Ltd., Suwon, Rep. of Korea

[21] Appl. No.: 09/141,768

[22] Filed: Aug. 27, 1998

[30] Foreign Application Priority Data

Nov. 18, 1997 [KR] Rep. of Korea ............ 97-60816

[51] Int. Cl.$^7$ .......... H01L 23/48; H01L 23/485; H01L 27/04
[52] U.S. Cl. .......... 438/688; 438/607; 438/614; 438/761; 438/762; 117/9; 117/937; 117/939; 118/724
[58] Field of Search .......... 438/688, 607

[56] References Cited

U.S. PATENT DOCUMENTS

| | | | |
|---|---|---|---|
| 4,382,099 | 5/1983 | Legge et al. | 427/34 |
| 4,861,417 | 8/1989 | Mochizuki et al. | 156/610 |
| 4,931,132 | 6/1990 | Aspnes et al. | 156/601 |
| 5,091,289 | 2/1992 | Cronin et al. | 430/312 |
| 5,108,941 | 4/1992 | Paterson et al. | 438/396 |
| 5,256,162 | 10/1993 | Drowley et al. | 29/25.01 |
| 5,270,247 | 12/1993 | Sakuma et al. | 117/89 |
| 5,300,185 | 4/1994 | Hori et al. | 158/610 |
| 5,310,711 | 5/1994 | Drowley et al. | 438/565 |
| 5,330,610 | 7/1994 | Eres et al. | 117/86 |
| 5,458,084 | 10/1995 | Thorne et al. | 117/89 |
| 5,480,818 | 1/1996 | Matsumoto et al. | 438/150 |
| 5,483,919 | 1/1996 | Yokoyama et al. | 117/89 |
| 5,540,783 | 7/1996 | Eres et al. | 118/725 |
| 5,747,113 | 5/1998 | Tsai | 427/255.5 |
| 5,811,349 | 9/1998 | Watabe | 438/478 |
| 5,858,102 | 1/1999 | Tsai | 118/719 |
| 5,879,459 | 3/1999 | Gadgil et al. | 118/715 |

*Primary Examiner*—Tom Thomas
*Assistant Examiner*—Bernard E. Souw
*Attorney, Agent, or Firm*—Marger Johnson & McCollom, P.C.

[57] ABSTRACT

A method for forming an Al layer using an atomic layer deposition method is disclosed. First, a semiconductor substrate is loaded into a deposition chamber. Then, an Al source gas is supplied into the deposition chamber and the Al source gas is chemisorbed into the semiconductor substrate to form the Al layer. Next, a purge gas is supplied onto the deposition chamber without supplying the Al source gas so that the unreacted Al source gas is removed, thereby completing the Al layer. To form an Al layer to a required thickness, the step of supplying the Al source gas and the step of supplying the purge gas are repeatedly performed, thereby forming an Al atomic multilayer. Therefore, the uniformity and step coverage of the Al layer can be greatly improved.

14 Claims, 3 Drawing Sheets

METHOD FOR MANUFACTURING ALUMINUM METAL INTERCONNECTION LAYER BY ATOMIC LAYER DEPOSITION METHOD

BACKGROUND OF THE INVENTION

1. Field of the Invention

The present invention relates to a method for forming a metal interconnection for a semiconductor device, and more particularly, to a method for forming an aluminum layer by an atomic layer deposition method.

2. Description of the Related Art

To complete a highly integrated circuit by integrating a plurality of unit devices, the respective unit devices must be electrically connected. The connection process of the unit devices is referred to as a metal interconnection process. As interconnection materials, aluminum (Al) having low resistivity and good step coverage is most typically used. To form an Al layer, a sputtering method as a physical method and a chemical vapor deposition method as a chemical method have been widely used.

According to the sputtering method, the productivity is high and the Al fabrication process is easy. However, it has a problem of poor step coverage. On the contrary, the chemical vapor deposition method has an advantage in that the step coverage is good. However, according to the chemical vapor deposition method, there is a problem in that the film forming parameters are complex and a coarse Al layer is formed in the case when the Al layer thickness exceeds a predetermined level.

In the sputtering method, the reason for the lowering of step coverage is because of a shadow effect. That is, some stepped parts are can not covered with metal particles, since the metal particles are incident straight forwardly from the upper portion of the step, when the Al layer is formed on an underlying layer having a large step caused by a high aspect ratio contact hole.

The thickness of the metal interconnection film becomes nonhomogeneous locally at the stepped portion due to the shadow effect, which lowers the step coverage. Further, since the aspect ratio increases as the integration level of the device increases, the step coverage further deteriorates.

In the case of forming the Al layer by the chemical vapor deposition method, the nucleation and growth of the Al layer occur irrespective of the step of the substrate surface. Thus, the step coverage is excellent. However, if the thickness of the Al layer exceeds about 1000 A, island-like deposition characteristics are exhibited so that the surface of the Al layer becomes coarse. The coarse Al layer is not suitable for a horizontally long metal interconnection. Also, a contact hole or a via having a large aspect ratio cannot be filled uniformly.

Therefore, to manufacture a metal interconnection for a highly integrated circuit, a new technique which can improve uniformity of an Al layer and has excellent conformality to improve step coverage of the Al layer is required.

SUMMARY OF THE INVENTION

To solve the above problems, it is an object of the present invention to provide a method for forming a metal interconnection by an atomic layer deposition method which can improve the uniformity and step coverage of the metal interconnection, and more particularly, to a method for forming an aluminum (Al) layer widely used as a metal interconnection material by an atomic layer deposition method.

According to the present invention for achieving the above object, first, a semiconductor substrate is loaded into a deposition chamber. Then, an Al source gas is supplied into the deposition chamber and the Al source gas is chemisorbed into the semiconductor substrate to form an Al layer. Next, a purge gas is supplied into the deposition chamber without supplying the Al source gas so that the unreacted Al source gas is removed, thereby completing the formation of the Al layer. To form an Al layer to a required thickness, the step of supplying the Al source gas and the step of supplying the purge gas are repeatedly performed, thereby forming a multilevel Al layer.

Also, it is preferred that the step of supplying the purge gas is followed by the steps of removing impurities present in the Al layer by supplying an Al layer reducing gas into the deposition chamber without supplying the purge gas, and removing the unreacted reducing gas by supplying the purge gas without supplying the reducing gas. Also, it is preferred that a multilevel Al layer is formed by repeatedly performing the steps of supplying the Al source gas, supplying the purge gas, supplying the reducing gas and supplying the purge gas again.

According to another aspect of the present invention, a semiconductor substrate is loaded into an atomic layer deposition chamber (step (a)). An Al source gas is supplied into the deposition chamber and then chemisorbed into the semiconductor substrate to form an Al layer. Then, a purge gas is supplied into the deposition chamber without supplying the Al source gas so that the unreacted Al source gas is removed. These steps are repeatedly performed to a multilevel Al layer (step (b)). Next, a gas which can reduce the Al layer and can dope the Al layer is supplied into the deposition chamber without supplying the purge gas, thereby removing impurities present in the Al layer and simultaneously supplying the doping gas into the Al layer. Then, the unreacted reducing gas is removed by supplying the purge gas without supplying the reducing and doping gas. These steps are repeatedly performed (step (c)).

In this case, the multilevel Al layer is preferably formed by repeatedly performing the steps (b) and (c).

In the present invention, the Al source gas is formed by heating solid Al or an Al alloy, or by evaporating an Al halide solution or a metal organic deposition source selected from the group consisting of triisobutyl aluminum, dimethyl aluminum hydride, trimethyl aluminum and dimethylethylamine alane.

As the purge gas, an inert gas or $N_2$ gas is used. Also, when the Al source gas is supplied, it is preferable that the Al source gas flows smoothly by mixing a carrier gas with the Al source gas and supplying the mixture. As the carrier gas, the same gas as the purge gas is used. As the reducing gas, Zn, Cu, W, a gas containing a —H group as a reducing group, $TiCl_4$, $WF_6$ or $CuCl_x$ is used.

DESCRIPTION OF THE PREFERRED EMBODIMENTS

Hereinbelow, preferred embodiments of the present invention will be described in detail with reference to accompanying drawings. The present invention is not restricted to the embodiments disclosed hereinbelow, and may be implemented in various different ways. However, these embodiments are provided so that this disclosure will be thorough and complete, and will fully convey the scope of the invention to those skilled in the art.

Figure 1:
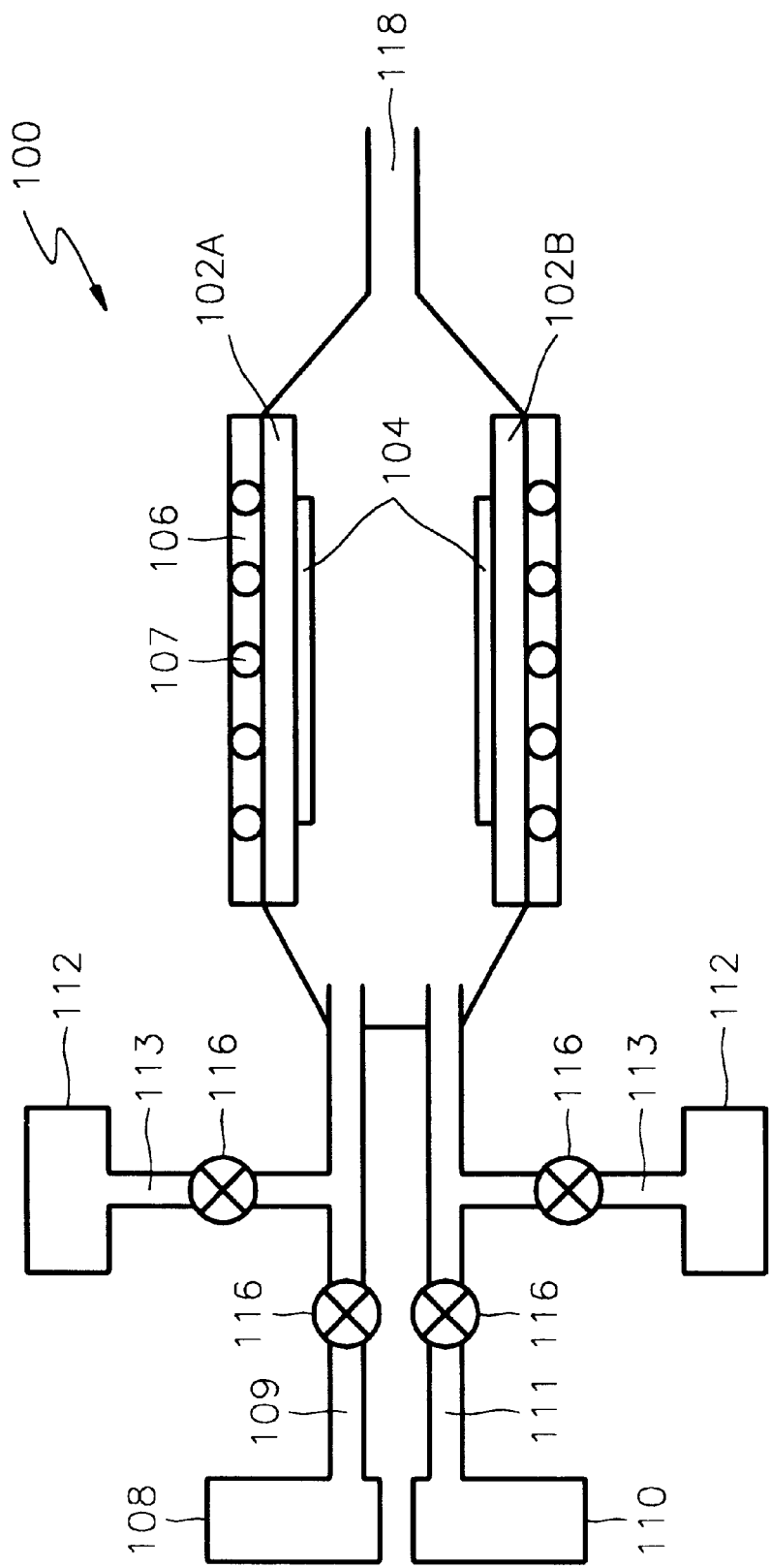
FIG. 1 is a sectional view illustrating an atomic layer deposition apparatus used in depositing an Al layer, according to the present invention.

FIG. 1 is a schematic diagram of an atomic layer deposition apparatus for forming an Al layer according to the present invention. As shown in FIG. 1, two semiconductor substrate props 102A and 102B facing each other are installed in a deposition chamber 100. The semiconductor props 102A and 102B are very closely installed so as to allow reactant gases to be chemisorbed. Also, a heating block 106 is formed in the outer surface of the deposition chamber 100 where the semiconductor substrate props 102A and 102B are installed. A plurality of heaters 107 are disposed in the heating block 106 to maintain the semiconductor substrate 104 at a constant temperature.

A plurality of gas supply tubes 109 and 111 for flowing the reactant gases into the deposition chamber 100 are installed at one end of the deposition chamber 100 and a gas exhaust pipe 118 is installed at the other end of the deposition chamber 100. The number of gas supply tubes may change depending on the number of reactant gases flowed into the deposition chamber 100. Only two gas supply tubes are shown in FIG. 1, for the sake of explanation.

One end of the gas supply tube 109 is connected to an Al source supplier 108 and the other gas supply tube 111 is connected to a reducing gas supplier 110. Thus, the reactant gas is supplied into the deposition chamber 100 from the gas suppliers 108 and 110 through the gas supply tubes 109 and 111. Also, purge gas supply tubes 113 connected to purge gas suppliers 112 for supplying the purge gases which exhaust the unreacted gas are connected to the gas supply tubes 109 and 111, respectively.

Valves 116 are installed in the respective gas supply tubes 109, 111 and 113 so that the purge gas or reactant gases may be flowed or blocked by the valves 116 turned on/off. The valves 116 are preferably adjusted by a programmed controller which controls an on/off state of the valves by a predetermined period, like pneumatic valves.

Figure 2:
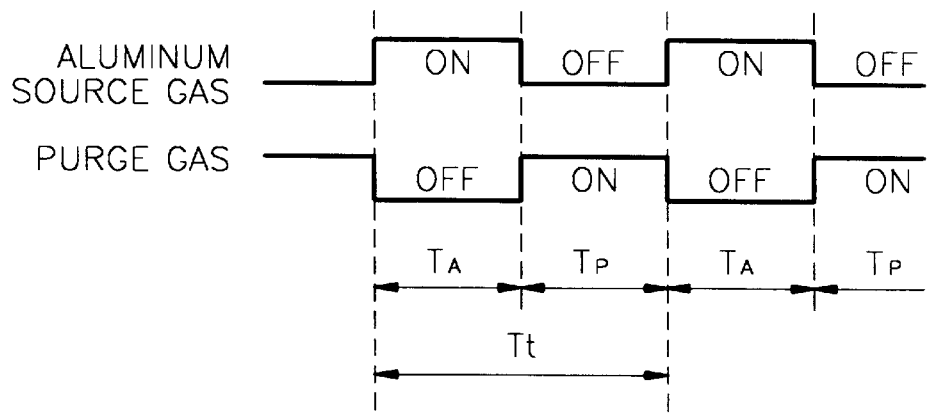
FIG. 2 is a timing diagram of the gas supply for depositing an Al layer on a semiconductor substrate, according to a first embodiment of the present invention.

FIG. 2 is a timing diagram of the gas supply for depositing an Al layer on a semiconductor substrate, according to a first embodiment of the present invention. Hereinbelow, the method for forming an Al layer will be described with reference to FIGS. 1 and 2.

The semiconductor substrate 104 on which an Al layer is to be formed is loaded into the atomic layer deposition chamber 100. Next, the Al source gas is flowed into the deposition chamber 100 from the Al source supplier 108 through the Al source supply tube 109 for a period of time $T_A$, which is sufficient to form an atomic layer such that the Al source gas is chemisorbed on the semiconductor substrate.

In this case, for smooth flow of the Al source gas, a carrier gas is mixed with the Al source gas, to then be flowed into the deposition chamber 100. The temperature of the semiconductor substrate 104 is adjusted by the heaters 107 in the heating block 106. The Al source gas supply material may be a solid, liquid or gas. In the case that the Al source gas supply material in a solid or liquid phase, the material is heated to be transformed into a gaseous phase, and then are supplied to the deposition chamber 100.

After the Al source gas is supplied for a time $T_A$, the valve 109 connected to the Al source supply tube 109 is closed and the valve 116 connected to the purge gas supply tube 113 is opened so that the purge gas is supplied from the purge gas supplier 112 to the deposition chamber 100 for a period of time $T_p$, which is sufficient to remove the unreacted gas, thereby removing the Al source gas which is not chemisorbed on the semiconductor substrate 104 and remains in the deposition chamber 100 through the gas exhaust pipe 118. As the Al source gas supply materials, carrier gas and purge gas, the following materials entered in Table 1 can be used.

TABLE 1

| Type | | Kind | |
|---|---|---|---|
| Al Deposition source | Solid | Pure Al Al alloy of Cu, Ti, Ta, Si, Ag or W | |
| | Liquid | Al compound containing halide atom | AlCl$_3$ |
| | | Metal organic deposition source | TIBA(Triisobutyl aluminum), DMAH(dimethylaluminum hydride), TMA(trimethyl aluminum), DMEAA(dimethylethylamine alane) |
| | Gas | Pure Al Al alloy | |
| Carrier gas or purge gas | | Inert gas (Ar or He) N$_2$ | |

As described above, in the method for forming an Al layer according to a first embodiment of the present invention, an Al layer having a constant thickness is deposited through a cycle ($T_t$) comprised of the steps of supplying an Al source gas and supplying a purge gas. Since the thickness of the Al layer increases proportionally with the number of deposition cycles, a thin film having a desired thickness can be deposited on the semiconductor substrate 104 by repeating the deposition cycle ($T_t$). In this case, the thickness of the Al layer deposited per cycle ($T_t$) is determined by the flow rate and flow time length of the Al source gas and purge gas flowed into the deposition chamber 100. If the Al layer is formed according to a first embodiment of the present invention, the uniformity and conformality of the Al layer are improved. Therefore, if the Al layer formed according to the present invention is used as a metal interconnection, the reliability of the metal interconnection is improved.

Figure 3:
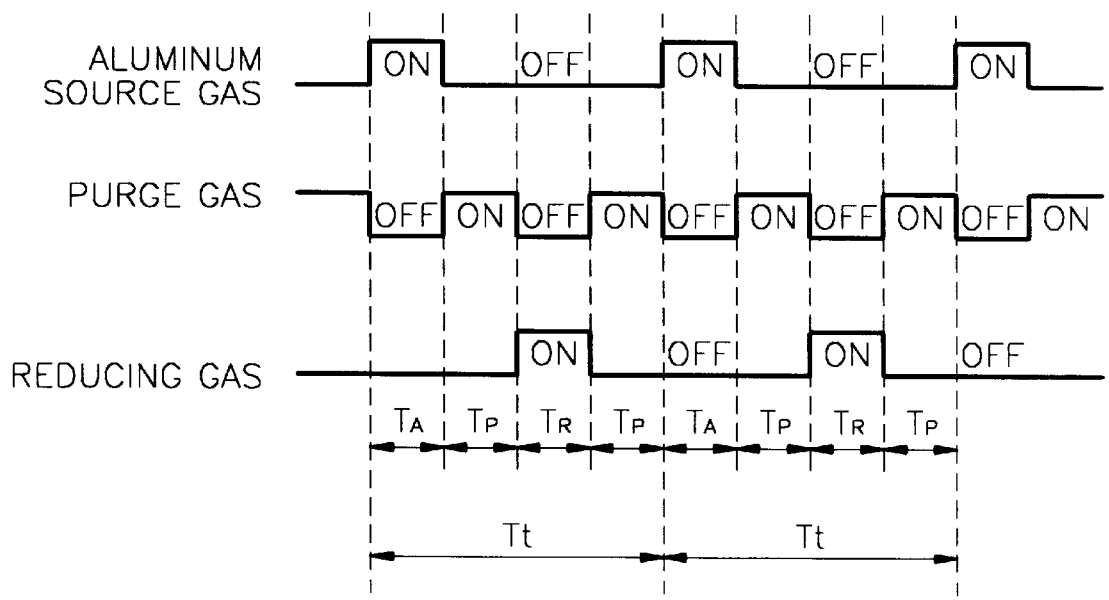
FIG. 3 is a timing diagram of the gas supply for depositing an Al layer on a semiconductor substrate, according to a second embodiment of the present invention.

FIG. 3 is a timing diagram of the gas supply for depositing an Al layer on a semiconductor substrate, according to a second embodiment of the present invention.

The difference between the first and second embodiments is in that the step of forming an Al layer by injecting an Al source gas is followed by the step of injecting a reducing gas for removing the impurities in the Al layer.

In other words, the same steps as those in the first embodiment are performed up to the step of supplying the purge gas for a time $T_p$, after supplying the Al source gas for a time $T_A$. Then, the valves 116 connected to the Al source gas supply tube 109 and the purge gas supply tube 113 are closed and the valves 116 connected to the reducing gas supply tube 111 are opened, so that the reducing gas is supplied from the reducing gas supplier 110 to the deposition chamber 100 for a time $T_R$ through the reducing gas supply tube 111.

The reducing gas is supplied for the purpose of removing impurities present in the Al layer deposited on the semiconductor substrate. For example, in the case of using $AlCl_3$ as the Al source gas, if an impurity such as chlorine remains in the Al layer, the electrical characteristics of the Al layer deteriorates. Thus, as the reducing gas, a gas, e.g., Zn, easily reacting with a halogen atom such as chlorine, is supplied. Otherwise, $H_2$, $SiH_4$ or $B_2H_6$, containing —H as a reducing group, easily reacting with a halogen atom, can be used as the reducing gas. Then, chlorine atom reacts with the supplied reducing gas to then be removed in the form of ZnCl or HCl.

In other words, since the impurity present in the Al layer is easily removed by the reducing gas which can react with the impurity in the Al layer, the electrical characteristics of the Al layer can be improved. The kinds of usable reducing agent are entered in the following Table 2.

TABLE 2

| Type | | Kind |
| --- | --- | --- |
| Reducing agent for reducing Al deposition source | Gas | Zn, Cu or W gas<br>$H_2$, $SiH_4$ or $B_2H_6$ gas, containing —H as reducing group<br>$TiCl_4$, $WF_6$ or $CuCl_x$ gas |
| | Plasma | Zn, Cu or W plasma<br>$H_2$, $SiH_4$ or $B_2H_6$ plasma, containing —H as reducing group<br>$TiCl_4$, $WF_6$ or $CuCl_x$ plasma |

Also, the reducing agent is more preferably supplied in a plasma state, rather than a gaseous state. This is because the plasma, being in an activated state, easily causes a reducing reaction. Therefore, the impurity can be easily removed, which allows the Al layer to be formed faster. As described above, according to the second embodiment of the present invention, through one cycle ($T_t$) including the step of supplying a Al source ($T_A$) the step of supplying a purge gas ($T_P$), the step of supplying a reducing gas ($T_R$) and the step of supplying a purge gas ($T_P$), in sequence, an Al layer having a predetermined thickness is deposited. Thus, an Al layer having a desired thickness can be formed by repeating the cycle ($T_t$) Al. The thickness of the Al layer deposited for each cycle ($T_t$) is determined by the flow rate and the flow time length of the Al source, reducing gas and purge gas supplied into the deposition chamber.

Also, starting from the step of supplying a purge gas, the cycle can be executed sequentially by the steps of supplying a purge gas (step $T_P$), supplying an Al source gas (step $T_A$), supplying a purge gas (step $T_P$) and supplying a reducing gas ($T_R$). In the case of the purge gas having purge and reducing functions, the same steps as those in the first embodiment can be performed, without the step of supplying a reducing gas.

Figure 4:
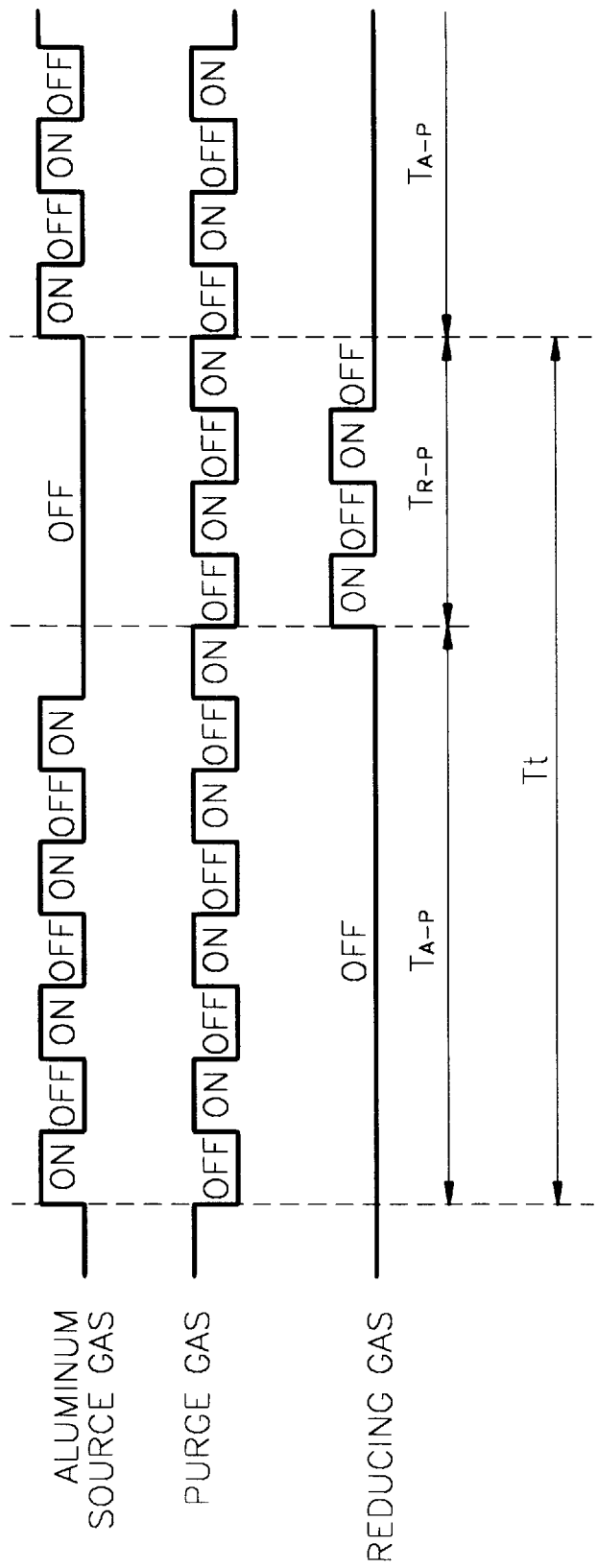
FIG. 4 is a timing diagram of the gas supply for depositing an Al layer on a semiconductor substrate, according to a third embodiment of the present invention.

FIG. 4 is a timing diagram of the gas supply for depositing an Al layer on a semiconductor substrate, according to a third embodiment of the present invention.

In the third embodiment, the same steps as those in the first embodiment are performed up to the steps of forming an Al atomic multilayer ($T_{A-P}$), by repeatedly performing the steps of supplying an aluminum source and supplying a purge gas n times. However, after the step of forming the Al atomic multilayer, unlike the first embodiment, the step ($T_{R-P}$) of doping impurities into the Al atomic multilayer may be further performed by sequentially performing the steps of supplying a reducing and doping impurity gas and supplying a purge gas m times. In a macroscopic views, in the third embodiment, the steps of forming the Al atomic multilayer and doping an impurity are repeatedly constitute one cycle ($T_t$), and the number of repetition of the cycle ($T_t$) is determined depending on the desired thicknesses of the aluminum layer.

Here, if a pure aluminum layer is formed, atoms migrate well by electron collision so that the aluminum interconnection is easily disconnected. That is why the impurity is doped. Thus, in the third embodiment, the migration characteristics are improved by injecting doping impurity gas into the aluminum atomic multilayer, thereby lengthening the life of the aluminum layer. The materials which can be used as the doping impurity gas in the third embodiment are entered in Table 3.

TABLE 3

| Type | Kind |
| --- | --- |
| Doping impurity gas | Zn, Cu or W<br>$SiH_4$ or $B_2H_6$<br>$TiCl_4$, $WF_6$ or $CuCl_x$ |

Although the present invention has been described with reference to specific embodiments, it is to be understood that the present invention is not limited to those embodiments and that various modifications and changes thereof may be effected by one skilled in the art without departing from the spirit or scope of the invention as defined in the appended claims.

As described above, the aluminum depositing method according to the present invention increases the step coverage of an aluminum layer, compared to the conventional sputtering method. Also, compared to the CVD method, the surface of the aluminum layer is uniformly formed. Therefore, if the aluminum layer formed by the present invention is used as the metal interconnection, the reliability of the metal interconnection is improved.

What is claimed is:

1. A method for forming an aluminum metal interconnection layer comprising the steps of:

loading a semiconductor substrate into an atomic layer deposition chamber;

forming an Al metal interconnection layer by supplying an Al source gas into the deposition chamber to be chemisorbed onto the semiconductor substrate; and removing unreacted Al source gas by supplying a purge gas into the deposition chamber without supplying the Al source gas, wherein the Al source gas is formed by heating solid Al or Al alloy.

2. The method according to claim 1, wherein an Al atomic multilayer is formed by repeatedly performing the steps supplying an Al source gas and supplying a purge gas.

3. The method according to claim 1, wherein the purge gas is an inert gas or $N_2$ gas.

4. The method according to claim 1, wherein the step of supplying an Al source gas comprises the step of:

supplying a carrier gas together with the Al source gas such that the Al source gas is flowed smoothly.

5. The method according to claim 4, wherein the carrier gas is the same gas as the purge gas.

6. The method according to claim 1, wherein the step of supplying the purge gas is followed by the steps of;

removing impurities present in the Al layer by supplying a reducing gas into the deposition chamber without supplying the purge gas; and removing the unreacted reducing gas by supplying the purge gas without supplying the reducing gas.

7. The method according to claim 6, wherein the steps of supplying the Al source gas, supplying the purge gas, supplying the reducing gas and supplying the purge gas are repeatedly performed to form an Al atomic multilayer.

8. The method according to claim 6, wherein the reducing gas is one selected from the group consisting of Zn, Cu, W, a gas containing a —H group as a reducing group, $TiCl_4$, $WF_6$ and $CuCl_x$.

9. The method according to claim 8, wherein the reducing gas is supplied in the form of a plasma.

10. A method for forming an aluminum metal interconnection layer comprising the steps of:
   (a) loading a semiconductor substrate into an atomic layer deposition chamber;
   (b) forming an Al metal interconnection atomic multilayer by repeatedly performing the steps of supplying an Al source gas into the deposition chamber to be chemisorbed onto the semiconductor substrate, and removing an unreacted Al source gas by supplying a purge gas into the deposition chamber without supplying the Al source gas, wherein the Al source gas is formed by heating solid Al or Al alloy; and
   (c) repeatedly performing the steps of removing the impurity present in the Al atomic multilayer and simultaneously supplying a doping gas into the Al layer by supplying a gas which can reduce the Al layer and can dope impurities into the Al atomic multilayer into the deposition chamber without supplying the purge gas, and removing the unreacted reducing and doping gas by supplying the purge gas without supplying the reducing and doping gas.

11. The method according to claim 10, wherein the steps (b) and (c) are sequentially and repeatedly performed.

12. The method according to claim 10, wherein the purge gas is an inert gas or $N_2$ gas.

13. The method according to claim 10, wherein the reducing and doping gas is one selected from the group consisting of Zn, Cu, W, a gas containing a —H group as a reducing group, $TiCl_4$, $WF_6$ and $CuCl_x$.

14. The method according to claim 13, wherein the reducing and doping gas is supplied in the form of a plasma.

* * * * *